United States Patent
Nakayama et al.

(10) Patent No.: US 12,306,213 B2
(45) Date of Patent: May 20, 2025

(54) CURRENT SENSOR

(71) Applicant: Alps Alpine Co., Ltd., Tokyo (JP)

(72) Inventors: Keisuke Nakayama, Miyagi-ken (JP); Takahiro Taoka, Miyagi-ken (JP); Manabu Tamura, Miyagi-ken (JP)

(73) Assignee: Alps Alpine Co., Ltd., Tokyo (JP)

(*) Notice: Subject to any disclaimer, the term of this patent is extended or adjusted under 35 U.S.C. 154(b) by 139 days.

(21) Appl. No.: 17/962,969

(22) Filed: Oct. 10, 2022

(65) Prior Publication Data
US 2023/0032086 A1    Feb. 2, 2023

Related U.S. Application Data

(63) Continuation of application No. PCT/JP2021/016065, filed on Apr. 20, 2021.

(30) Foreign Application Priority Data

May 29, 2020 (JP) .................. 2020-094424

(51) Int. Cl.
*G01R 19/00* (2006.01)
*G01R 15/20* (2006.01)

(52) U.S. Cl.
CPC ....... *G01R 15/205* (2013.01); *G01R 19/0092* (2013.01)

(58) Field of Classification Search
CPC ............ G01R 15/205; G01R 15/202; G01R 19/0092; G01R 15/14; G01R 15/148;
(Continued)

(56) References Cited

U.S. PATENT DOCUMENTS 8,513,950 B2   8/2013 Tanabe
9,410,991 B2 * 8/2016 Masuda ............... G01R 15/207
(Continued)

FOREIGN PATENT DOCUMENTS

EP      3176590      6/2017
JP    2005-188935    7/2005
(Continued)

OTHER PUBLICATIONS

International Search Report from International Application No. PCT/JP2021/016065 dated Jul. 6, 2021.

*Primary Examiner* — Son T Le
(74) *Attorney, Agent, or Firm* — Beyer Law Group LLP

(57) ABSTRACT

A current sensor according to the present invention includes a bus bar through which a measuring current flows; a nut with which the bus bar and an external terminal are brought into contact with and fastened to each other; a magnetic sensor capable of detecting a magnetic field generated when a current flows through the bus bar; a case member having a housing area in which the magnetic sensor is allowed to be housed, the case member sealing the bus bar and the nut inside; and a cover member provided over the housing area. The case member has an open part in which a portion of the nut is exposed. The open part is covered by an insulative protective member. Therefore, shavings generated when a bolt for fastening an external terminal is screwed into the nut are prevented from dropping to the outside of the current sensor.

7 Claims, 13 Drawing Sheets

(58) Field of Classification Search
CPC .......... G01R 15/20; G01R 1/04; G01R 19/00; G01R 1/0416; G01R 15/207
See application file for complete search history.

(56) References Cited

U.S. PATENT DOCUMENTS

| | | |
|---|---|---|
| 10,038,175 B2 | 7/2018 | Liu et al. |
| 10,317,435 B2 | 6/2019 | Okuzuka |
| 10,962,573 B2 | 3/2021 | Nomura et al. |
| 2019/0267729 A1* | 8/2019 | Horiuchi .............. H01R 13/447 |

FOREIGN PATENT DOCUMENTS

| | | |
|---|---|---|
| JP | 2005-188945 | 7/2005 |
| JP | 2011-164008 | 8/2011 |
| JP | 2016-170127 | 9/2016 |
| JP | 2017-102024 | 6/2017 |
| JP | 6402089 | 9/2018 |

* cited by examiner

CURRENT SENSOR

CLAIM OF PRIORITY

This application is a Continuation of International Application No. PCT/JP2021/016065 filed on Apr. 20, 2021, which claims benefit of Japanese Patent Application No. 2020-094424 filed on May 29, 2020. The entire contents of the application noted above are hereby incorporated by reference.

BACKGROUND OF THE INVENTION

1. Field of the Invention

The present invention relates to a current sensor configured to detect a measuring current from a magnetic field generated when the measuring current flows through a bus bar.

2. Description of the Related Art

A current sensor disclosed by Japanese Patent No. 6402089 includes a case in which a conductor and a magnetic sensor are positioned relative to each other and that has a first opening through which the magnetic sensor is insertable into a housing space, an insulative lid that covers the first opening and has a second opening through which the conductor is made to extend to the outside of the case, and a lid magnetic shield that is positioned on the lid. The case includes a positioning portion having an outer edge engaging with the second opening of the lid and at which the case is positioned. The positioning portion has an opening in which a cylindrical conductive nut engaging with one end of the conductor is placed and fixed. The nut forms a part of a terminal electrode through which the conductor is to be electrically in contact with a counterpart terminal. The nut is integrally molded in the case in such a manner as to be placed in an electrode-receiving area of the positioning portion of the case where the nut is electrically coupled to the one end of the conductor.

SUMMARY OF THE INVENTION

In the current sensor disclosed by Japanese Patent No. 6402089, however, in the process of integrally molding the nut and the case, the nut needs to be retained with a retaining pin or the like so as to be assuredly made electrically coupled to the one end of the conductor. Therefore, after the completion of the molding process, the part where the retaining pin has been in contact is exposed. In such a case, shavings generated when a bolt for fastening an external terminal to the bus bar is screwed into the nut may drop to the outside of the current sensor and cause some trouble. Furthermore, if such a current sensor having an exposed part is shipped and used, irrelevant matter may be taken into the current sensor through the exposed part and allow electricity to flow through an area that is to be insulated, resulting in insulation failure.

Instead of forming the nut in the case by insert molding, a portion of the conductor (bus bar) where an external terminal is to be connected may be made to project from the case so as to be fastened to the external terminal. However, in the process of fastening the external terminal to the conductor, the conductor and the nut need to be retained by using retaining jigs, making the fastening work complicated.

Accordingly, the present invention provides a current sensor while preventing the occurrence of any trouble due to shavings generated when a blot is screwed into a nut and while suppressing the occurrence of insulation failure by preventing the entry of irrelevant matter into an area where the nut is located. Furthermore, the present invention provides a current sensor that allows an external terminal to be easily fastened to a bus bar of the current sensor with no use of retaining jigs for retaining the bus bar and a nut.

To solve the above problems, a current sensor according to the present invention includes a bus bar through which a measuring current flows; a nut with which the bus bar and an external terminal are brought into contact with and fastened to each other; a magnetic sensor capable of detecting a magnetic field generated when a current flows through the bus bar; a case member having a housing area in which the magnetic sensor is allowed to be housed, the case member sealing the bus bar and the nut inside; and a cover member provided over the housing area. The case member has an open part in which a portion of the nut is exposed. The open part is covered by an insulative protective member.

In such a configuration, since the open part is covered by the protective member, shavings generated when a bolt is screwed into the nut are prevented from dropping to the outside of the current sensor. Furthermore, irrelevant matter is prevented from entering the inside of the case member through the open part or adhering to an area around the open part. Therefore, the occurrence of insulation failure is prevented.

In the current sensor according to the present invention, it is preferable that the protective member be integrally molded on the cover member. In such a configuration, the protective member is easily provided over the open part. Furthermore, since the necessity of separately preparing the protective member is omitted, the manufacturing process is simplified.

In the current sensor according to the present invention, it is preferable that letting a surface of the case member where the open part is provided be defined as a first counter surface; and a surface of the protective member that is located face to face with the first counter surface be defined as a second counter surface, one of the first counter surface and the second counter surface have a protrusion that surrounds an outer periphery of the open part when seen in a face-to-face direction for the first counter surface and the second counter surface, while the other of the first counter surface and the second counter surface has a depression that is engageable with the protrusion. In such a configuration, a gap that may be produced between the protrusion and the depression engaging with each other forms a labyrinth structure, which prevents the entry and leakage of irrelevant matter (including liquid). Furthermore, the protective member is easily attachable to the case member, which increases the manufacturing efficiency.

In the current sensor according to the present invention, it is preferable that the protrusion and the depression be each located at a flat surface included in a corresponding one of the first counter surface and the second counter surface. In such a configuration, the protrusion and the depression form a more complicated labyrinth structure, which more assuredly prevents the entry and leakage of irrelevant matter.

In the current sensor according to the present invention, it is preferable that the first counter surface have the protrusion while the second counter surface have the depression. In such a configuration, since the case member has the protrusion surrounding the outer periphery of the open part, the entry of irrelevant matter into the open part before the protective member is attached to the case member is prevented. Furthermore, a satisfactory thickness is provided to the periphery of the open part. Therefore, the nut is allowed to be fastened with increased strength.

In the current sensor according to the present invention, it is preferable that the open part have a recess that is recessed toward an inner side of the case member and in which the nut is placed, the recess being sealed with a sealing material that serves as the protective member covering the open part. In such a configuration, the open part is assuredly covered by the sealing material. Furthermore, the shape of the cover member is simplified. Therefore, the process of manufacturing the cover member is simplified.

In the current sensor according to the present invention, it is preferable that the magnetic sensor be provided on a substrate placed inside the case member, and the substrate and the cover member be fastened to the case member with screws that are shared between the substrate and the cover member. In such a configuration, the positioning of the magnetic sensor relative to the bus bar and the positioning of the protective member relative to the open part are achieved simultaneously and accurately. Consequently, measurement errors due to variations in the positions of relevant elements are reduced.

DESCRIPTION OF THE PREFERRED EMBODIMENTS

A current sensor 10 according to a first embodiment of the present invention will now be described in detail with reference to relevant drawings. The drawings are each provided with an XYZ coordinate system as a reference coordinate system. In the following description, the Z1-Z2 direction is referred to as the top-to-bottom direction, the X1-X2 direction is referred to as the front-to-rear direction (width direction), and the Y1-Y2 direction is referred to as the side-to-side direction (long-side direction). The X1-X2 direction and the Y1-Y2 direction are perpendicular to each other. An XY plane extending in the X1-X2 direction and in the Y1-Y2 direction is perpendicular to the Z1-Z2 direction. Seeing an element from the upper side (Z1 side) toward the lower side (Z2 side) is occasionally referred to as "plan view".

Figure 1A:
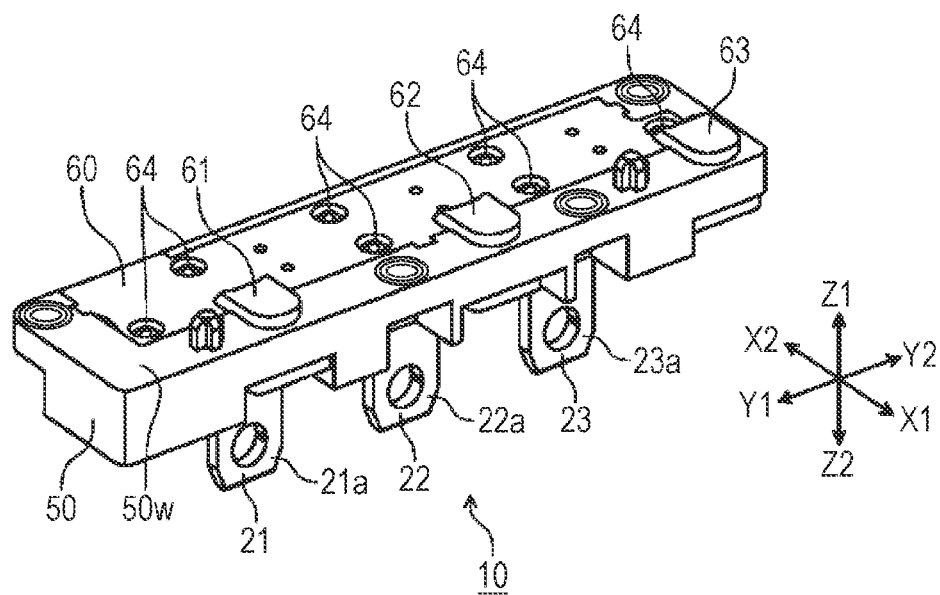
FIGS. 1A and 1B are perspective views illustrating a configuration of a current sensor according to a first embodiment of the present invention.
Figure 1B:
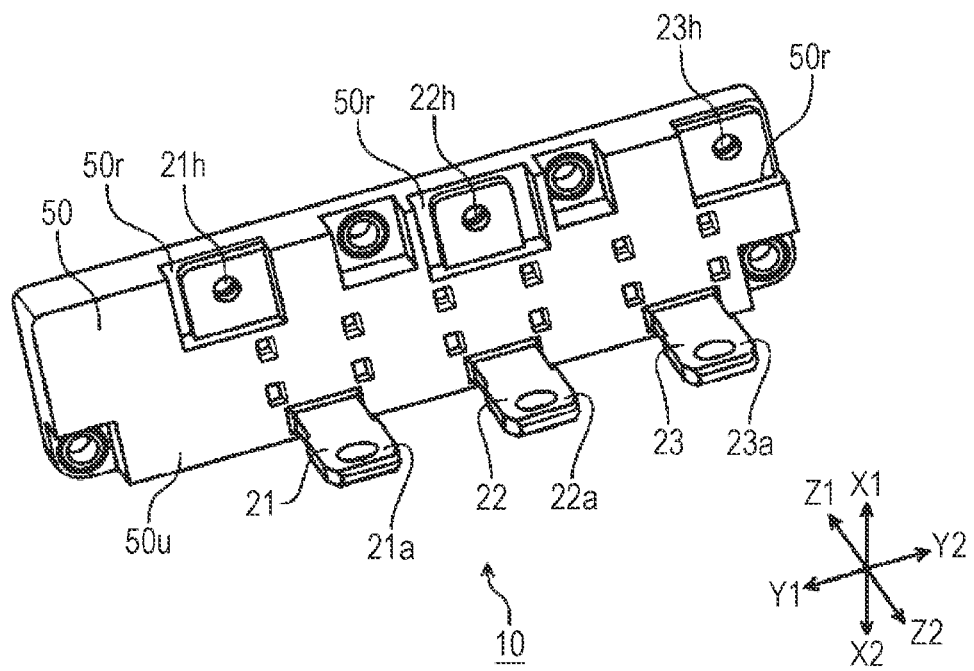
Figure 2A:
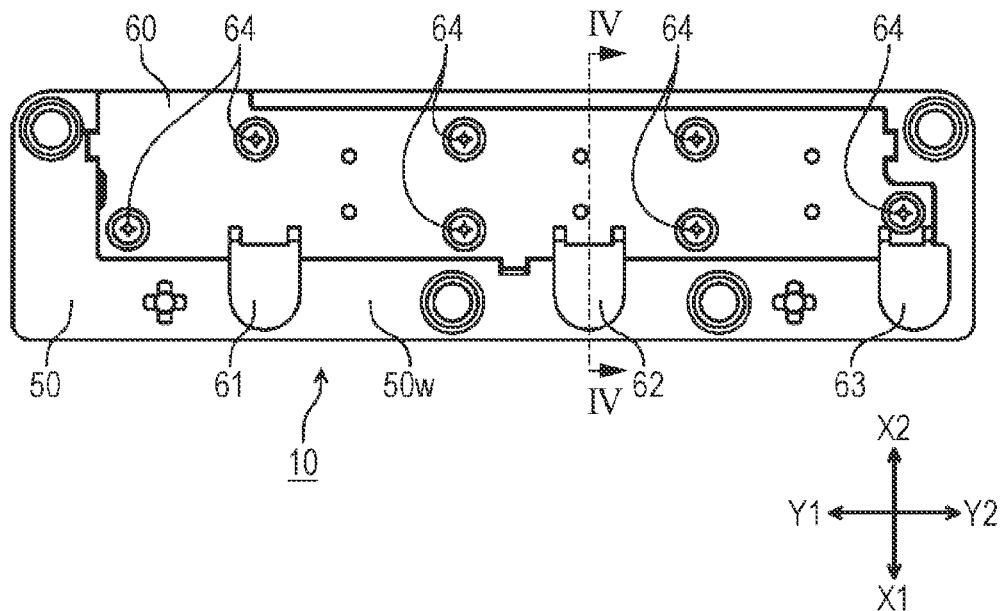
FIG. 2A is a plan view of the current sensor according to the first embodiment of the present invention.
Figure 2B:
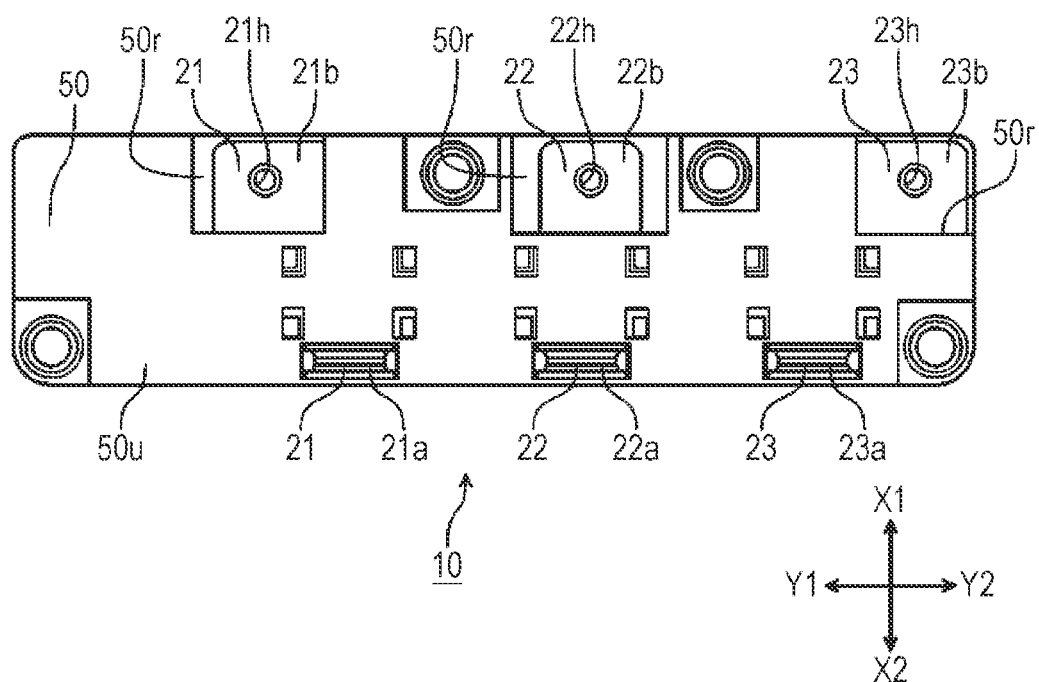
FIG. 2B is a bottom view of the current sensor illustrated in FIG. 2A.
Figure 3:
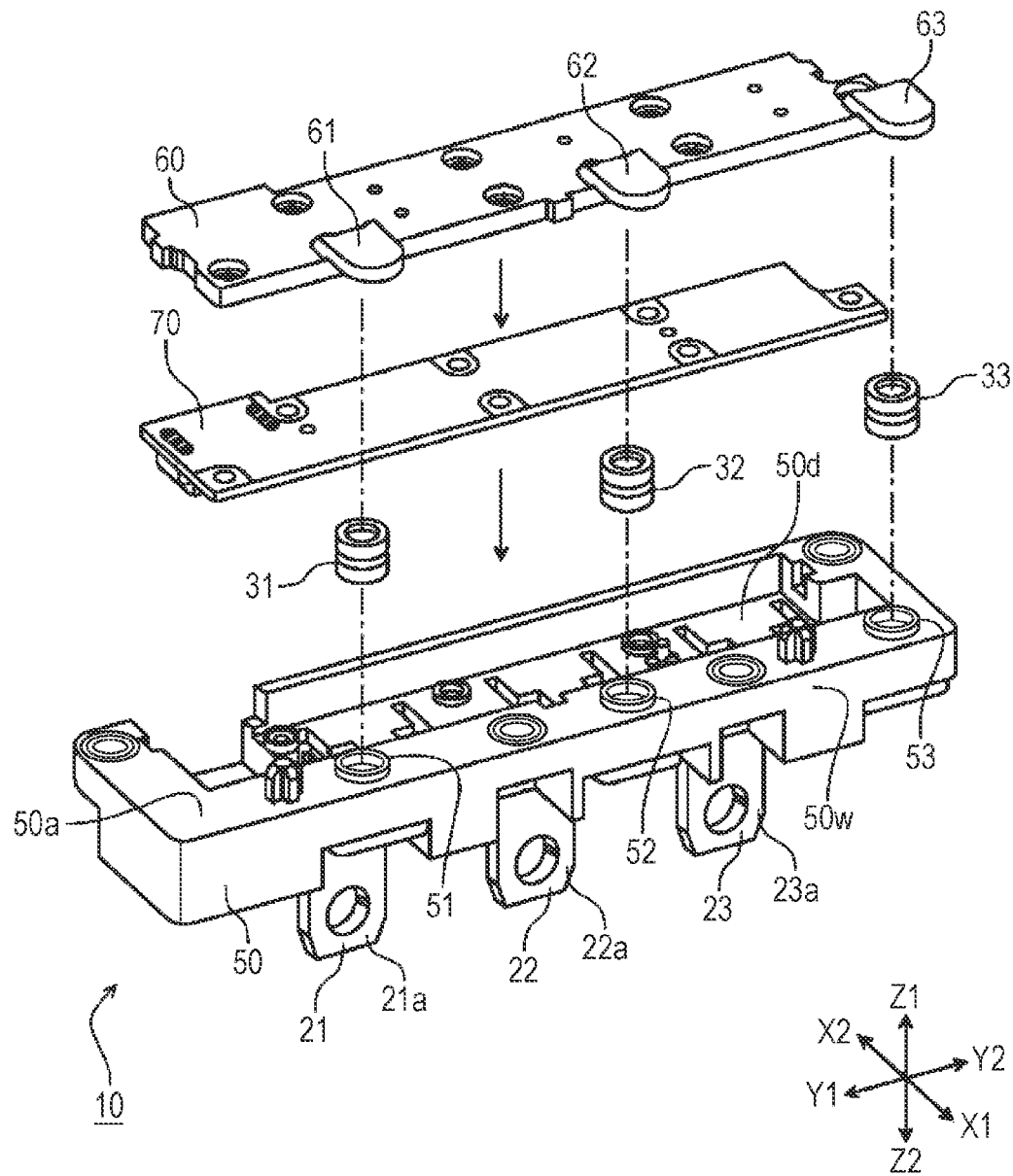
FIG. 3 is an exploded perspective view of the current sensor according to the first embodiment of the present invention.
Figure 4:
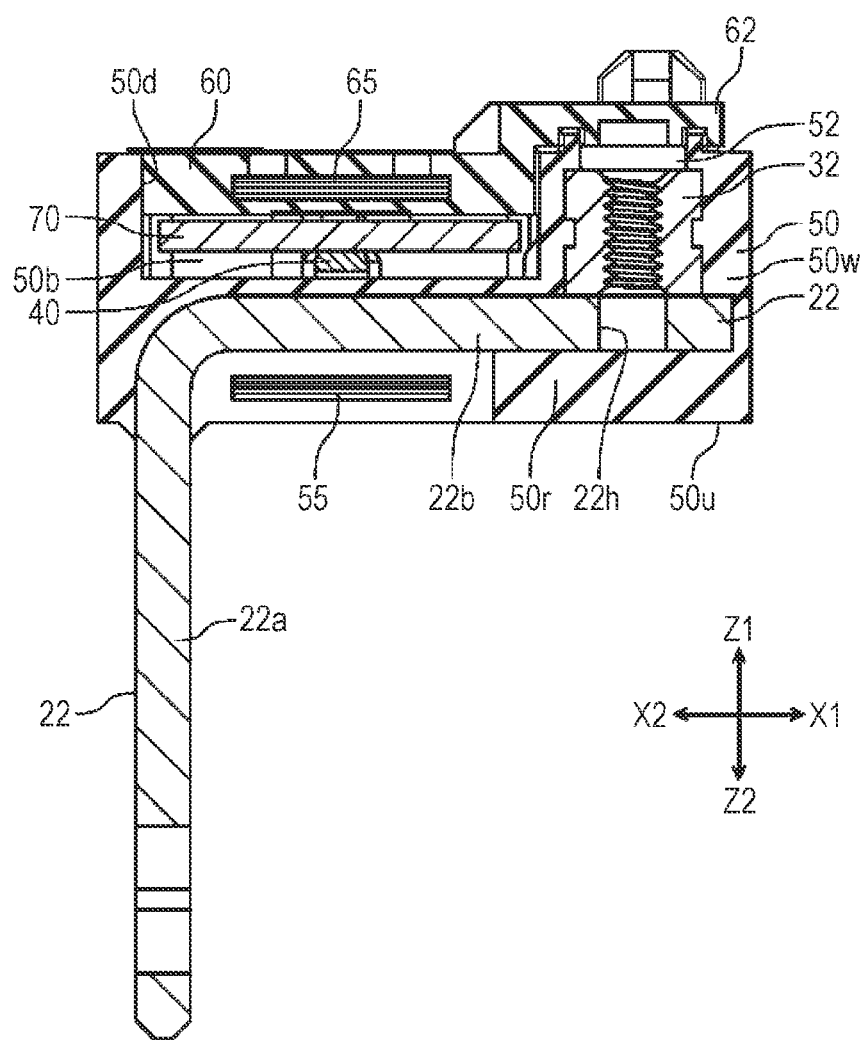
FIG. 4 illustrates a section taken along line Iv-Iv provided in FIG. 2A.
Figure 5:
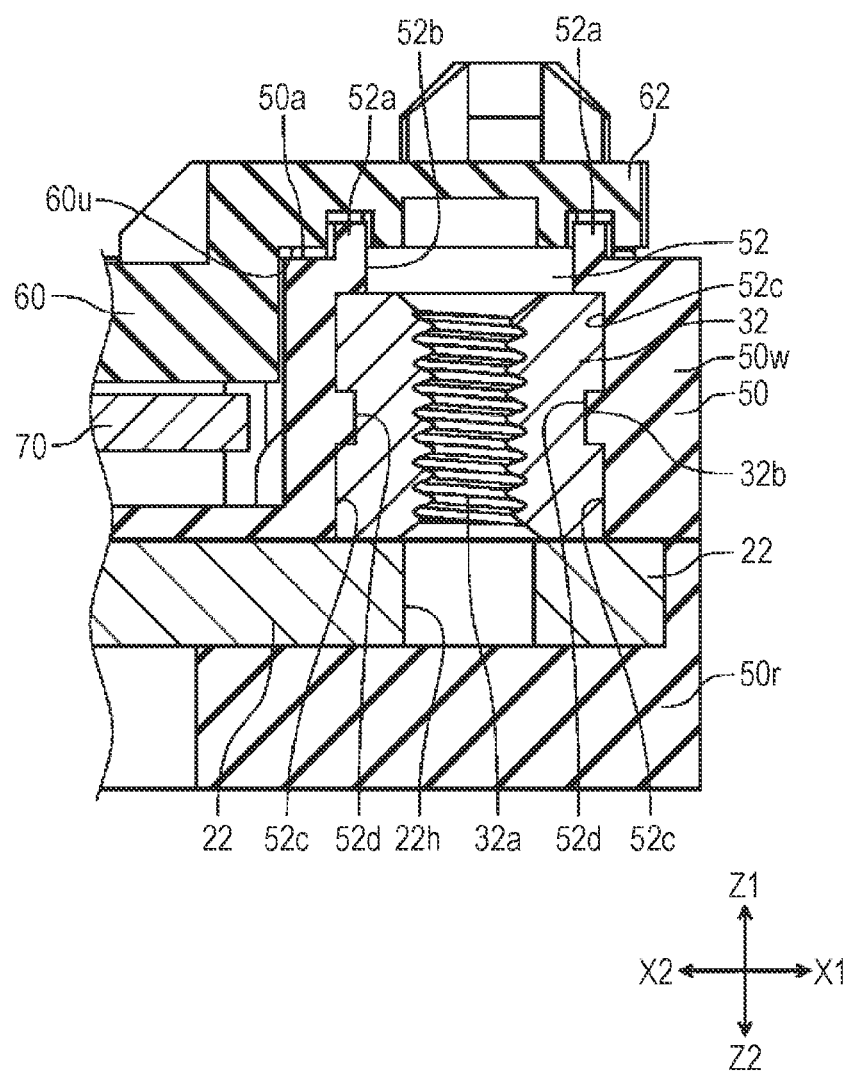
FIG. 5 is an enlargement of a part of FIG. 4 and illustrates an open part and elements therearound.
Figure 6:
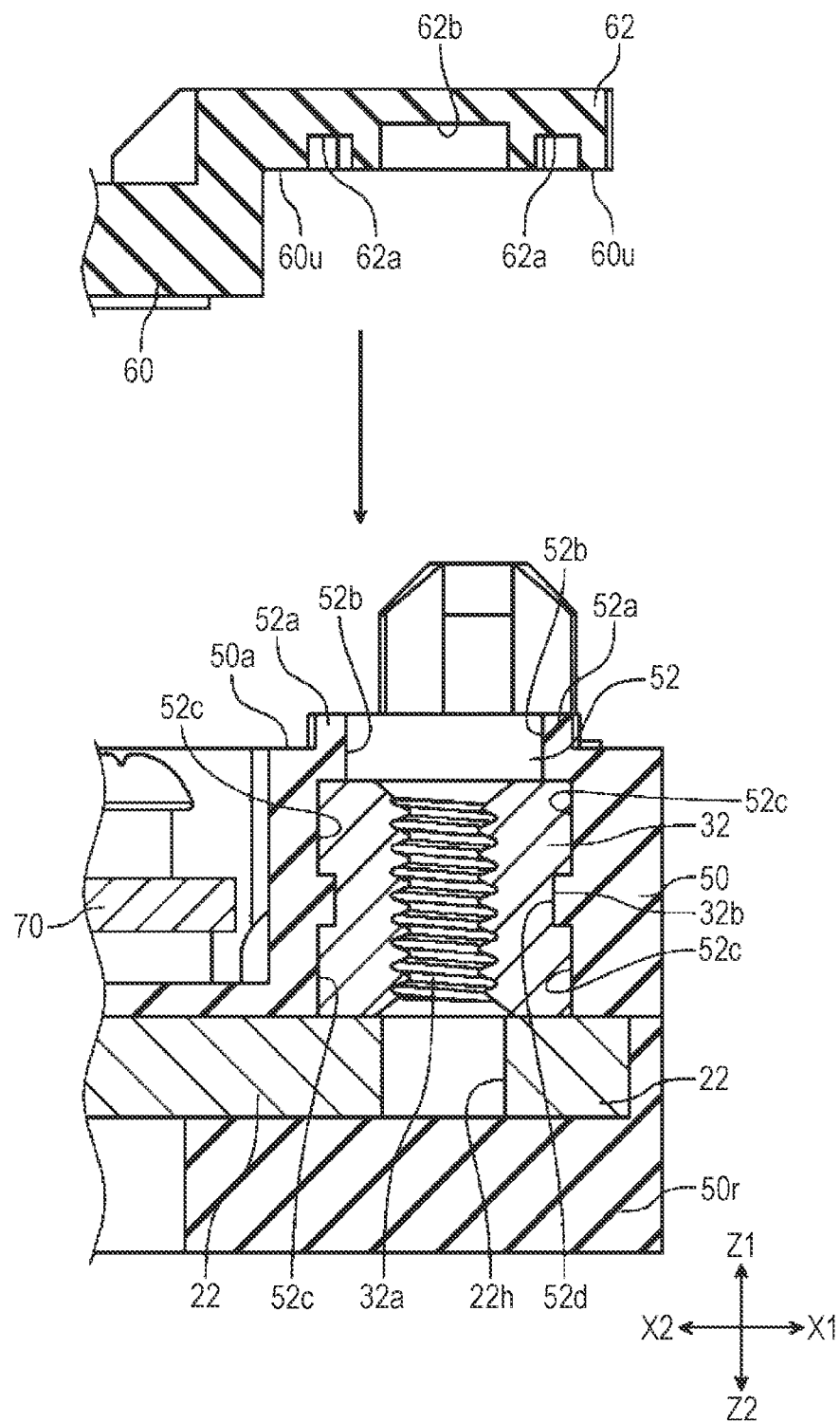
FIG. 6 is an enlargement of the part of FIG. 4 and illustrates the open part and elements therearound, with a cover member being separated from a case member.

FIGS. 1A and 1B are perspective views illustrating a configuration of the current sensor 10 according to the first embodiment: FIG. 1A illustrates an upper front side, and FIG. 1B illustrates a lower side. FIG. 2A is a plan view of the current sensor 10. FIG. 2B is a bottom view of the current sensor 10. FIG. 3 is an exploded perspective view of the current sensor 10. In FIG. 3, screws 64 for securing a cover member 60, first and second shielding members 55 and 65, and some other elements are not illustrated. FIG. 4 illustrates a section taken along line IV-IV provided in FIG. 2A. FIG. 5 is an enlargement of a part of FIG. 4 and illustrates a second open part 52 and relevant elements therearound. FIG. 6 illustrates the part corresponding to FIG. 5, with the cover member 60 being separated from a case member 50.

As illustrated in FIG. 3, the current sensor 10 includes first, second, and third bus bars 21, 22, and 23; first, second, and third nuts 31, 32, and 33; the case member 50; the cover member 60; and a substrate 70. The three nuts 31, 32, and 33 are provided for the respective bus bars 21, 22, and 23. Furthermore, referring to FIG. 4, the current sensor 10 includes magnetic sensors 40 and three pairs of first and second shielding members 55 and 65. The case member 50 has first, second, and third open parts 51, 52, and 53. While the present embodiment relates to a configuration including three bus bars 21, 22, and 23 in correspondence with which three nuts and three pairs of shielding members are provided, the number of bus bars may be set to any value in accordance with the specifications of the current sensor or other relevant factors.

Referring to FIG. 4, the second bus bar 22 is a metal plate that is bent substantially perpendicularly, thereby having an extended portion 22a and a secured portion 22b. The extended portion 22a extends downward from the case member 50. The secured portion 22b extends in the front-to-rear direction (X1-X2 direction) and is sealed in the case member 50. The secured portion 22b has an insertion hole 22h, which extends through the secured portion 22b in the thickness direction (the top-to-bottom direction: the Z1-Z2 direction). As illustrated in FIGS. 1B, 2B, and 4, the case member 50 has a bottom face 50u, in which recesses 50r are provided in such a manner as to be recessed upward. The insertion hole 22h is exposed to the outside in a corresponding one of the recesses 50r and allows the second bus bar 22 to be connected to an external terminal (not illustrated).

The first bus bar 21 and the third bus bar 23 are each also a plate made of the same metal as for the second bus bar 22 with the same thickness and width as for the second bus bar 22. The plate is bent substantially perpendicularly. Thus, the first bus bar 21 and the third bus bar 23 have respective extended portions 21a and 23a, and respective secured portions 21b and 23b. As with the case of the second bus bar 22, the extended portions 21a and 23a extend downward from the case member 50, and the secured portions 21b and 23b extend in the front-to-rear direction and are sealed in the case member 50. The case member 50 has a front wall portion 50w, in which the secured portions 21b and 23b extend in the side-to-side direction and away from each other. The secured portions 21b and 23b have respective insertion holes 21h and 23h, which extend through the secured portions 21b and 23b in the thickness direction (top-to-bottom direction). As illustrated in FIGS. 1B, 2B, and 4, the insertion holes 21h and 23h are exposed to the outside at the bottom face 50u of the case member 50.

The three bus bars 21, 22, and 23 extend parallel to one another in the side-to-side direction. The extended portions 21a, 22a, and 23a have the same width, the same thickness, and the same length. The secured portions 21b, 22b, and 23b have the same width and the same thickness. The insertion holes 21h, 22h, and 23h have the same shape and are located at the same position in the front-to-rear direction.

The case member 50 is made of an insulative material and has a substantially rectangular plan-view shape that is elongated in the side-to-side direction as illustrated in FIGS. 2A and 2B. As illustrated in FIG. 3, an upper rear portion of the case member 50 is depressed, whereby a stepped portion 50d is provided. A housing area 50b is provided at the bottom of the stepped portion 50d. The stepped portion 50d provides a space spreading downward from the upper surface, 50a, of the front wall portion 50w. The housing area 50b spreads downward from the bottom of the stepped portion 50d and can receive the magnetic sensors 40 and relevant elements, which are preferably provided on the lower surface of the substrate 70 (see FIG. 4).

As illustrated in FIG. 3, the upper surface 50a is preferably a flat surface spreading in an XY plane and is elongated in the side-to-side direction (Y1-Y2 direction) in the front wall portion 50w of the case member 50.

As illustrated in FIG. 3, the upper surface 50a (a first counter surface) of the case member 50 has three open parts 51, 52, and 53, which are at regular intervals in the side-to-side direction. The open parts 51, 52, and 53 are each a depressed part having a circular shape in plan view. A portion of each of the nuts 31, 32, and 33, which are integrated with the case member 50 by insert molding, is exposed in a corresponding one of the open parts 51, 52, and 53. In the process of molding the case member 50 together with the nuts 31, 32, and 33, members (retaining pins or the like) for retaining the nuts 31, 32, and 33 are placed at relevant positions in the mold. When the mold is released, the open parts 51, 52, and 53 are provided at the foregoing positions. The open parts 51, 52, and 53 are located at respective positions coinciding with the insertion holes 21h, 22h, and 23h provided in the bus bars 21, 22, and 23.

The case member 50 is formed by insert molding with the three bus bars 21, 22, and 23 and the three nuts 31, 32, and 33 being retained at respective predetermined positions defined in the case member 50.

As illustrated in FIGS. 5 and 6, in the front wall portion 50w of the case member 50 obtained by insert molding, the center axis of a screw thread 32a, which is provided in the second nut 32, and the center axis of the insertion hole 22h in the second bus bar 22 both extend in the top-to-bottom direction and coincide with each other. Therefore, when a fastening bolt (not illustrated) is inserted into the insertion hole 22h from the recess 50r of the case member 50 with an external terminal (not illustrated) being in contact with the bottom face of the second bus bar 22, the bolt is received by the screw thread 32a of the second nut 32. Hence, when the above bolt is fastened to the second nut 32 through the second bus bar 22, the external terminal that is in contact with the bus bar 22 is fastened to the second bus bar 22 and is thus electrically connected to the second bus bar 22.

Instead of integrating the second nut 32 with the case member 50 by insert molding, a portion of the second bus bar 22 where the insertion hole 22h is provided may be made to project from the front wall portion 50w of the case member 50 so that an external terminal (not illustrated) is to be fastened to the bottom face of the portion that is made to project. However, to fasten an external terminal to the second bus bar 22 in such a configuration, the second bus bar 22 and the second nut 32 need to be kept retained during the fastening process. In contrast, in the process of manufacturing the current sensor 10 according to the present embodiment that is configured as above, the second bus bar 22 and the second nut 32 are retained by retaining the case member 50. That is, the three elements do not need to be fixedly retained individually. Moreover, the case member 50 also serves as a jig that receives an external terminal (not illustrated).

While a technique of connecting an external terminal to the bus bar has been described with reference to FIGS. 4 to 6 by taking the case of the second bus bar 22 as an example, the above technique is also applicable to the electrical connection (contact-fastening) of external terminals to the first bus bar 21 and the third bus bar 23.

As illustrated in FIG. 3, the substrate 70 has a substantially rectangular oblong shape in plan view and is placed at the bottom of the stepped portion 50d of the case member 50 in such a manner as to cover the housing area 50b. The substrate 70 preferably has the magnetic sensors 40 fixed to the lower surface thereof. The magnetic sensors 40 are placed in the housing area 50b. One of the magnetic sensors 40 is positioned above the secured portion 22b of the second bus bar 22. Such an arrangement allows the magnetic sensor 40 to detect a magnetic field generated when a measuring current flows through the second bus bar 22. The magnetic sensor 40 includes, for example, a magnetoresistive device such as a GMR device (giant magnetoresistive device).

For the second bus bar 22, as illustrated in FIG. 4, the first shielding member 55 and the second shielding member 65 are paired in the direction (Z1-Z2 direction) normal to the XY plane in such a manner as to cover the magnetic sensor 40 from above and below. The first shielding member 55 is sealed in the case member 50 when the case member 50 is molded. The second shielding member 65 is sealed in the cover member 60 when the cover member 60 is molded. Thus, an external magnetic field is prevented from reaching the magnetic sensor 40. Therefore, the magnetic sensor 40 can accurately detect the magnetic field generated by the current that flows through the second bus bar 22.

Two other magnetic sensors 40 are also provided on the lower surface of the substrate 70 at respective positions above the first bus bar 21 and the third bus bar 23. The magnetic sensors 40 detect respective magnetic fields generated by respective currents that flow through the respective bus bars 21 and 23 toward which the magnetic sensors 40 face. As with the above case of the first shielding member 55 and the second shielding member 65, two other pairs of shielding members 55 and 65 are each sealed in a corresponding one of the case member 50 and the cover member 60 such that the two magnetic sensors 40 are each located between a corresponding one of the pairs of shielding members 55 and 65.

As illustrated in FIG. 1 or 3, the cover member 60 has a substantially rectangular oblong shape in plan view and is fastened to the case member 50 with seven screws 64 in such a manner as to cover the stepped portion 50d of the case member 50 and the substrate 70 placed therein. The screw holes provided in the cover member 60 are coaxial with the screw holes provided in the substrate 70 in the top-to-bottom direction (Z1-Z2 direction), so that the cover member 60 and the substrate 70 are screwed to the case member 50 with the screws 64, which are preferably shared between the cover member 60 and the substrate 70. In such a securing technique, the first shielding members 55, the second shielding members 65, the bus bars, and the magnetic sensors 40 are set in respective predetermined positions. Consequently, measurement errors due to variations in the positions of relevant elements are reduced. The cover member 60 is made of an insulative material and is obtained by molding, for example, resin. To obtain the cover member 60, insert molding is performed such that the above second shielding members 65 are sealed therein.

The cover member 60 has at the front end of the upper surface thereof three protective covers 61, 62, and 63, each serving as a protective member. The protective covers 61, 62, and 63 are located in correspondence with the three open parts 51, 52, and 53 provided in the case member 50. The protective covers 61, 62, and 63 are made of the same insulative material as for the cover member 60 and extend frontward from the front end of the cover member 60. The protective covers 61, 62, and 63 are each a plate having such a semicircular plan-view shape as to cover a corresponding one of the open parts 51, 52, and 53 from above. It is preferable that the protective covers 61, 62, and 63 be integrally molded on the cover member 60, in terms of easy and accurate positioning relative to the open parts 51, 52, and 53. If the protective covers 61, 62, and 63 are made of an elastic material, the protective covers 61, 62, and 63 are made to be elastically in contact with the open parts 51, 52, and 53 with increased tightness, which effectively prevents the entry of irrelevant matter into the open parts 51, 52, and 53.

Referring to FIGS. 5 and 6, letting the upper surface 50a of the case member 50 where the open parts 51, 52, and 53 are provided be defined as the first counter surface, a lower surface 60u of the cover member 60 preferably forms a flat surface (second counter surface) that is located face to face with the upper surface 50a (first counter surface). As illustrated in FIG. 6, the upper surface 50a of the case member 50 preferably has a protrusion 52a, which surrounds the outer periphery of the second open part 52 when seen in a face-to-face direction (Z1-Z2 direction) in which the upper surface 50a and the lower surface 60u are face to face with each other. On the other hand, the second protective cover 62 preferably has a depression 62a, which has such a shape as to engage with the protrusion 52a when the second protective cover 62 is placed over the second open part 52. The protrusion 52a has an inner peripheral surface 52b, which defines the circular plan-view shape of the second open part 52.

The shape of the second open part 52 and the shape of the second protective cover 62 provided for the second open part 52 also apply to the shapes of the others: the first open part 51 and the third open part 53, and the first protective cover 61 and the third protective cover 63 provided for the first open part 51 and the third open part 53.

As illustrated in FIG. 6, the protrusion 52a protrudes upward from the upper surface 50a of the case member 50 and has a ring shape in plan view. The depression 62a provided in the cover member 60 has a shape that fits the protrusion 52a, that is, a ring shape in bottom view.

The cover member 60 has a recess 62b. The recess 62b is provided on the inner side of the ring-shaped depression 62a and shares the center axis with the depression 62a. When the cover member 60 is placed on the case member 50, the recess 62b is located above the second nut 32 coaxially with the screw thread 32a of the second nut 32.

Note that the case member 50 may have a depression while the cover member 60 may have a protrusion that is engageable with the depression.

As illustrated in FIGS. 5 and 6, the inner peripheral surface 52b of the open part 52 is continuous with the inner peripheral surface of a housing space 52c, which is provided in the front wall portion 50w of the case member 50 and in which the second nut 32 is housed. The inner peripheral surface of the housing space 52c is shaped in conformity with the outer peripheral surface of the second nut 32. As illustrated in FIG. 6, the second nut 32 has in the outer peripheral surface thereof a groove 32b. The groove 32b is located substantially at the center in the top-to-bottom direction and is recessed inward. The inner peripheral surface of the housing space 52c has a projection 52d, which is shaped in conformity with the groove 32b. Accordingly, the groove 32b and the projection 52d mesh with each other. Thus, the strength of securing the second nut 32 to the case member 50 is increased. Hence, even if any external force is applied to the second nut 32 when an external terminal is screwed to the second bus bar 22 or after the external terminal is fastened to the second bus bar 22, the second nut 32 is prevented from coming off or being damaged.

The current sensor 10 is manufactured through an insert-molding step for obtaining the case member 50, an integral-molding step for obtaining the cover member 60, a mounting step for mounting relevant elements on the substrate 70, and an assembling step for attaching the substrate 70 and the cover member 60 in that order to the molded case member 50. External terminals are fastened to the respective bus bars 21, 22, and 23, and measuring currents are supplied to the respective bus bars 21, 22, and 23 to generate respective magnetic fields, which are detected by the respective magnetic sensors 40 provided for (provided face to face with) the respective bus bars 21, 22, and 23. With reference to the results of the detection, the values of the respective measuring currents are obtained.

The insert-molding step for obtaining the case member 50 is performed with the three bus bars 21, 22, and 23 and the three nuts 31, 32, and 33 being set in respective predetermined positions defined in the case member 50. Thus, the bus bars 21, 22, and 23 and the nuts 31, 32, and 33 are sealed in the case member 50. In this step, positioning members, such as pins, intended for the positioning of the nuts 31, 32, and 33 are provided in the mold for obtaining the case member 50. After the insert molding is complete, the positioning members are removed.

As a result of the insert-molding step, the extended portions 21a, 22a, and 23a of the three bus bars 21, 22, and 23 extend downward from the bottom face 50u of the case member 50, and the insertion holes 21h, 22h, and 23h are exposed at the bottom face 50u of the case member 50 so as to allow the connection of external terminals. Furthermore, after the removal of the above positioning members, the three nuts 31, 32, and 33 are exposed in part, specifically at the tops thereof, in the respective open parts 51, 52, and 53.

In the integral-molding step for obtaining the cover member 60, the cover member 60 and the three protective covers 61, 62, and 63 are integrally molded.

In the configuration obtained as above, the open parts 51, 52, and 53 are assuredly covered by the respective protective covers 61, 62, and 63 each serving as the protective member. Such a configuration prevents the occurrence of any trouble that would be caused if shavings generated by screwing bolts for fastening external terminals to the bus bars 21, 22, and 23 into the nuts 31, 32, and 33 drop to the outside of the current sensor 10. The above configuration further prevents the entry of irrelevant matter into the open parts 51, 52, and 53 or the housing spaces 52c provided in the case member 50 for housing the nuts 31, 32, and 33, thereby suppressing the occurrence of insulation failure.

Since the protective covers 61, 62, and 63 are integrally molded on the cover member 60, the protective covers 61, 62, and 63 are assuredly and accurately positioned over the respective open parts 51, 52, and 53.

Since the case member 50 has the protrusion 52a while the cover member 60 has the depression 62a at the position coinciding with the protrusion 52a, a gap that may be produced between the protrusion 52a and the depression 62a engaging with each other forms a labyrinth structure, which effectively prevents the entry and leakage of irrelevant matter. Furthermore, the positioning of the cover member 60 relative to the case member 50 in the assembling step is facilitated.

Figure 7:
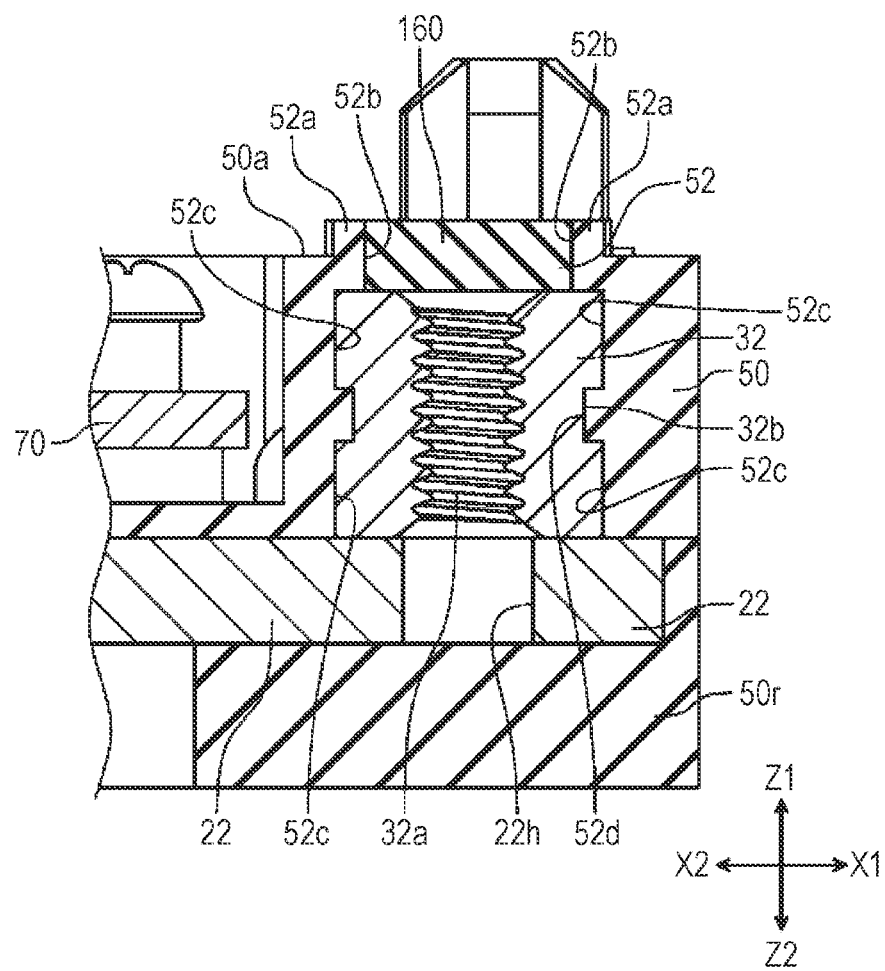
FIG. 7 illustrates a section of a case member according to a modification at a position corresponding to the position illustrated in FIGS. 5 and 6.

A modification of the first embodiment will now be described. FIG. 7 illustrates a section of a case member 50 according to a modification at a position corresponding to the position illustrated in FIGS. 5 and 6.

As illustrated in FIG. 7, the space (recess) surrounded by the inner peripheral surface 52b of the second open part 52 is preferably sealed with an insulative sealing material 160, which serves as the protective member and is, for example, a resin material. Thus, the entry of irrelevant matter into the second open part 52 is prevented. The insulative sealing material 160 is provided after the insert-molding step for obtaining the case member 50: after the removal of the positioning members provided for the positioning of the nuts 31, 32, and 33 and before the assembling step for attaching the substrate 70 and the cover member 60 to the case member 50.

The above configuration and step of sealing the recess with the insulative sealing material 160 also applies to the first open part 51 and the third open part 53: the open parts other than the second open part 52. In the above configuration according to the modification, a cover member that does not include the protective covers 61, 62, and 63 may alternatively be employed. Nevertheless, employing the cover member 60 including the protective covers 61, 62, and 63 as in the above embodiment enhances the effect of preventing the entry of irrelevant matter.

Figure 8A:
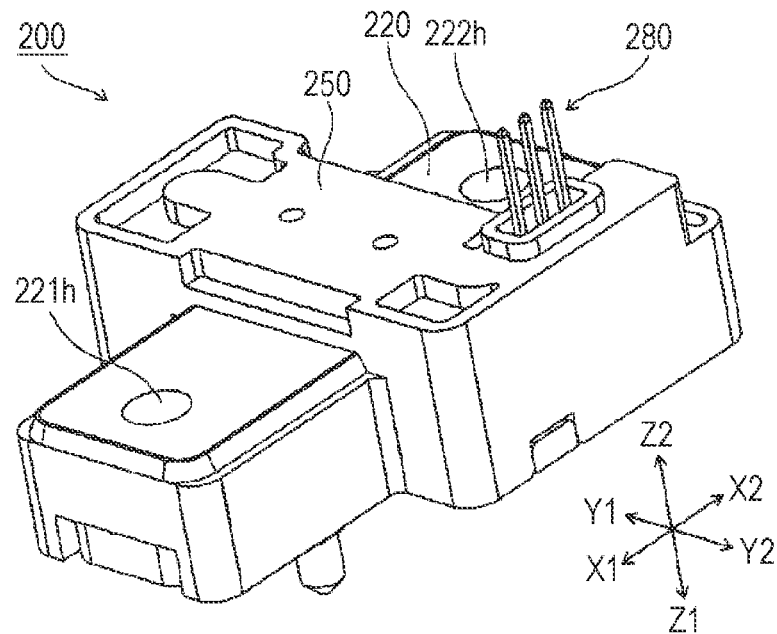
FIGS. 8A and 8B are perspective views illustrating a configuration of a current sensor according to a second embodiment of the present invention.
Figure 8B:
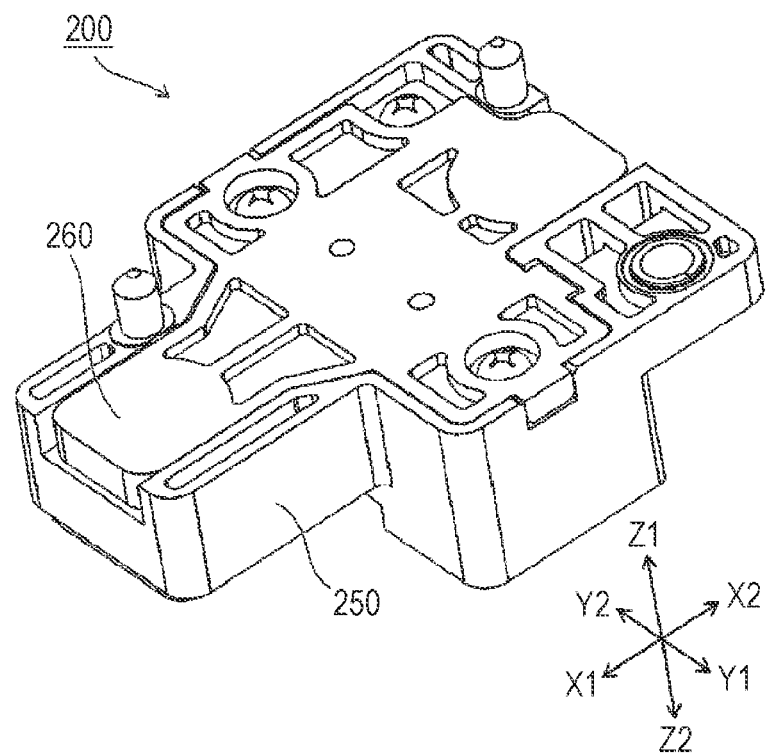
Figure 9:
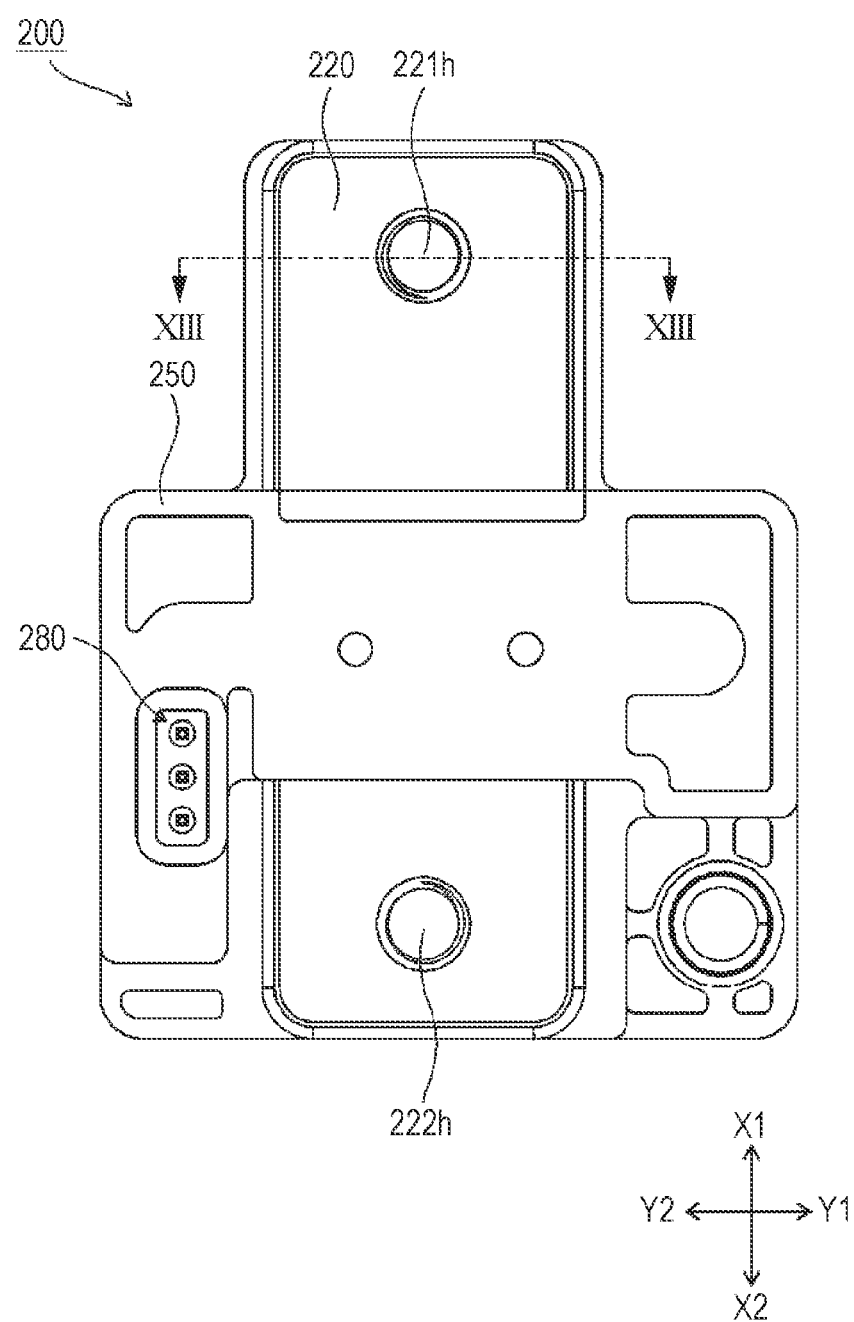
FIG. 9 is a bottom view of the current sensor according to the second embodiment of the present invention.
Figure 10:
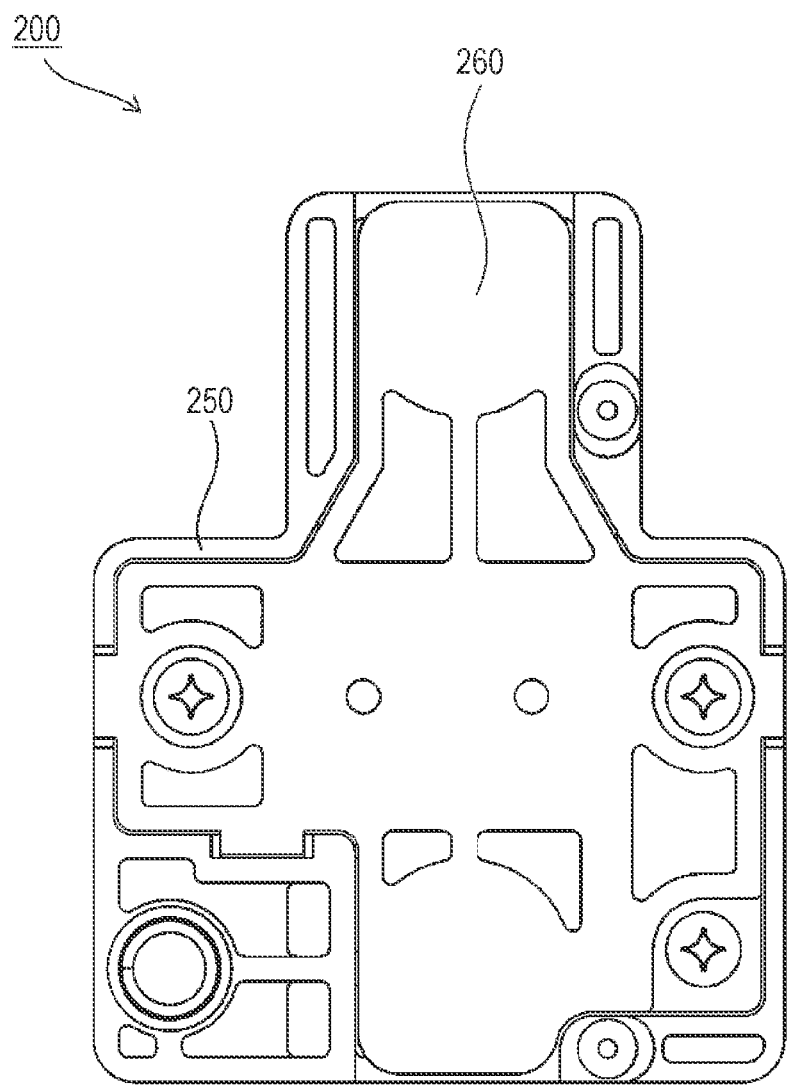
FIG. 10 is a plan view of the current sensor according to the second embodiment of the present invention.
Figure 10:
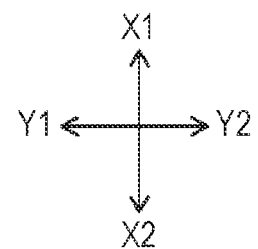
Figure 11A:
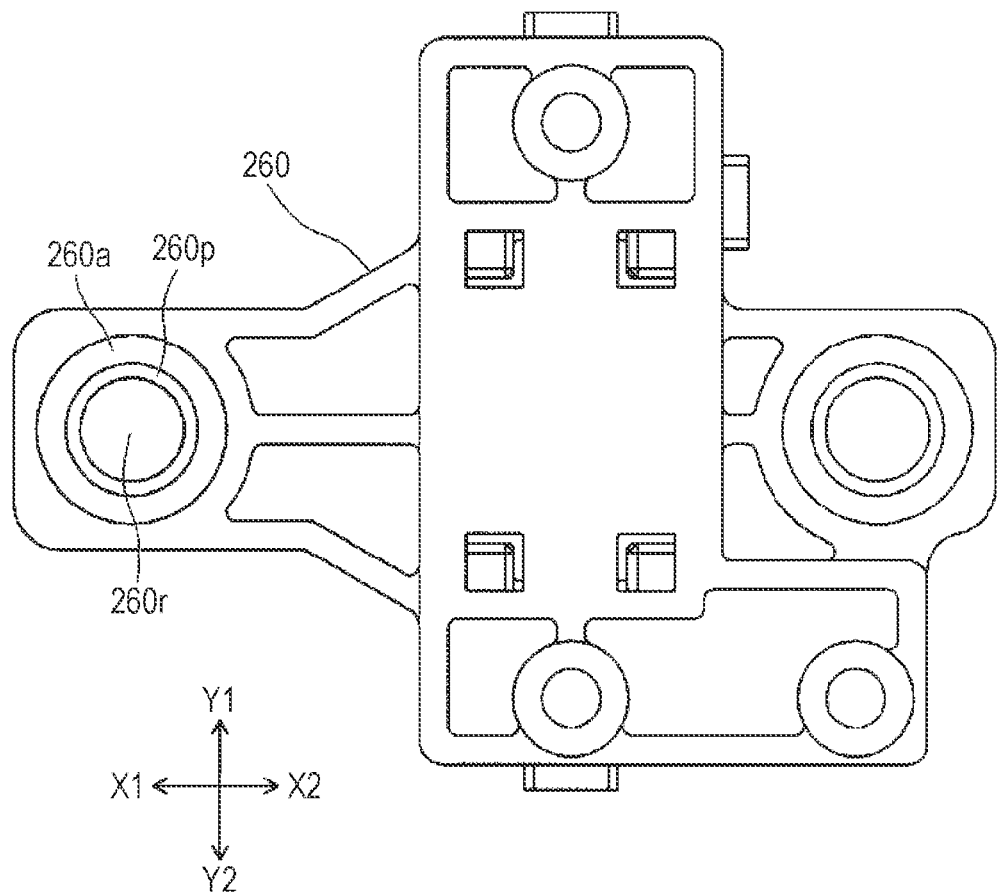
FIGS. 11A and 11B are a bottom view and a side view, respectively, of a cover member included in the current sensor according to the second embodiment of the present invention.
Figure 11B:
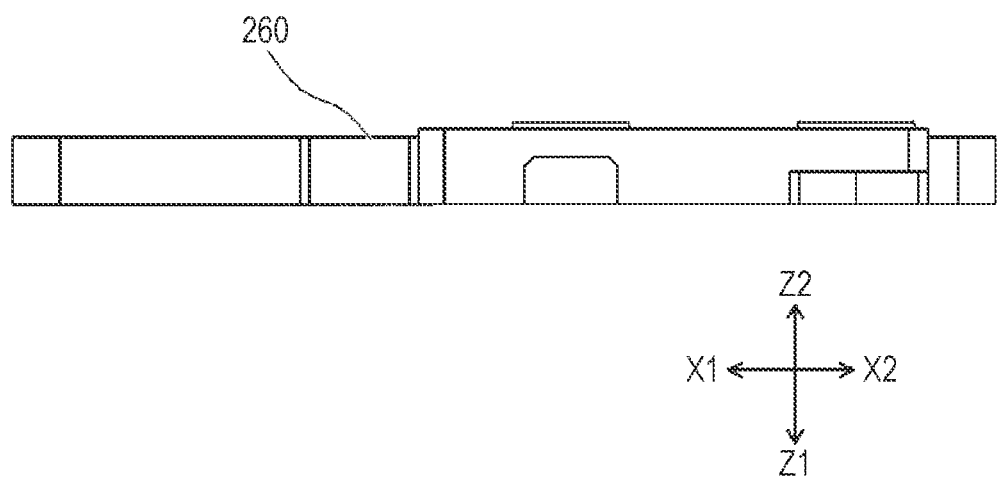
Figure 12:
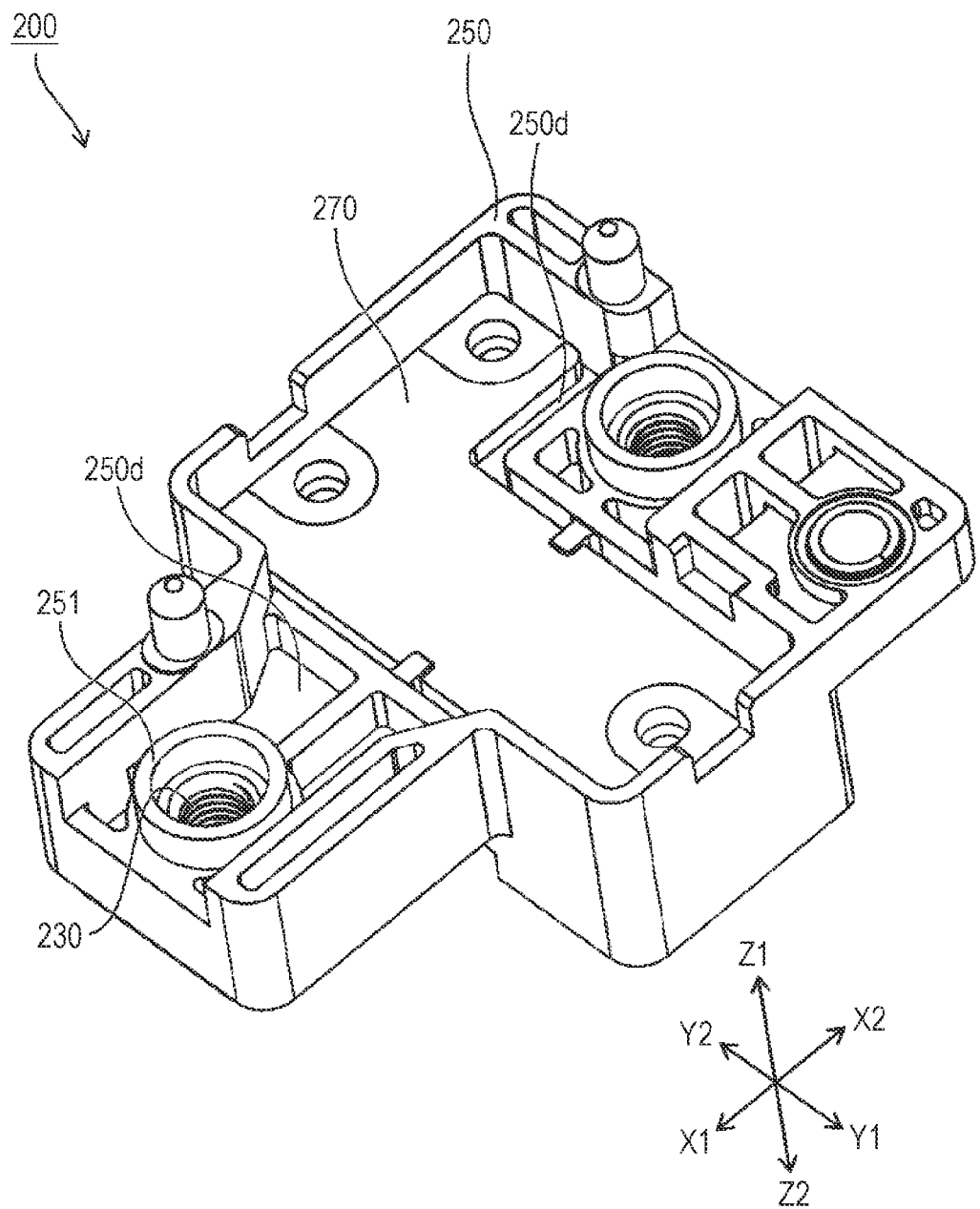
FIG. 12 illustrates the current sensor according to the second embodiment of the present invention.

A configuration of a current sensor according to a second embodiment of the present invention will now be described. FIGS. 8A and 8B are perspective views illustrating a configuration of the current sensor according to the second embodiment of the present invention: FIG. 8A illustrates a lower side, and FIG. 8B illustrates an upper side. FIG. 9 is a bottom view of the current sensor according to the second embodiment of the present invention. FIG. 10 is a plan view of the current sensor according to the second embodiment of the present invention. FIG. 11A is a bottom view of a cover member included in the current sensor according to the second embodiment of the present invention. FIG. 11B is a side view of the cover member illustrated in FIG. 11A. FIG. 12 illustrates a case member included in the current sensor according to the second embodiment of the present invention.

As with the current sensor 10 according to the first embodiment of the present invention, the current sensor, 200, according to the second embodiment of the present invention illustrated in FIGS. 8A and 8B and others includes a case member 250, in which a bus bar 220 is incorporated. The bus bar 220 is a plate made of an electrically conductive material and extends in the X1-X2 direction. Portions of the bus bars 220 at the two respective ends in the X1-X2 direction are exposed and have respective insertion holes 221h and 222h. The current sensor 200 includes a plurality of connector pins 280, through which power is received from the outside and signals are outputted to the outside. The connector pins 280 project toward the Z2 side in the Z1-Z2 direction.

As illustrated in FIGS. 8B and 10, a cover member 260 is provided on a face of the current sensor 200 that is on the Z1 side in the Z1-Z2 direction. In the cover member 60 of the current sensor 10 according to the first embodiment illustrated in FIG. 3, the protective covers 61, 62, and 63 that are positioned over the open parts 51, 52, and 53 where the nuts 31, 32, and 33 are placed project relative to the other portion of the cover member 60 on the side toward which the open parts 51, 52, and 53 are open (the Z1 side in the Z1-Z2 direction). In contrast, the cover member 260 according to the second embodiment illustrated in FIG. 11B has no projections on the side toward which open parts 251 of the case member 250 are open (the Z1 side in the Z1-Z2 direction, see FIG. 12). In FIG. 12, the cover member 260 is removed for easy recognition of the internal configuration of the case member 250.

As illustrated in FIG. 12, the case member 250 of the current sensor 200 according to the second embodiment has a stepped portion 250d, in which a substrate 270 is placed, as with the case of the current sensor 10 according to the first embodiment. However, the second embodiment is different from the first embodiment in that the stepped portion 250d extends up to the peripheries of the open parts 251. Since the stepped portion 250d extends up to the peripheries of the open parts 251, the cover member 260 does not have any projections, corresponding to the protective covers 61, 62, and 63 provided on the cover member 60 of the current sensor 10 according to the first embodiment, on the Z1 side thereof in the Z1-Z2 direction. Such a respect of the current sensor 200 according to the second embodiment is another difference from the first embodiment. Therefore, when the cover member 260 is attached to the case member 250, the entirety of the cover member 260 is placed in the stepped portion 250d. That is, the current sensor 200 has no projections on the Z1 side thereof in the Z1-Z2 direction. Such a configuration increases the degree of freedom in the position of the current sensor 200 in a device in which the current sensor 200 is to be incorporated.

Figure 13:
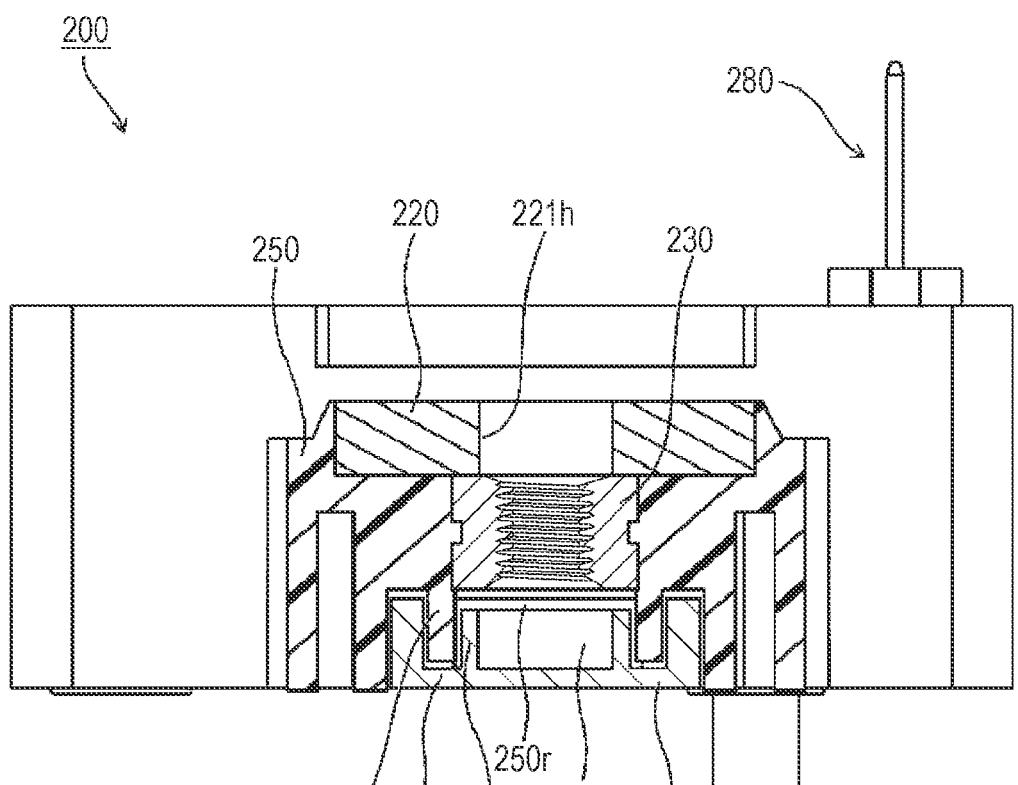
FIG. 13 illustrates a section taken along line XIII-XIII provided in FIG. 9.

FIG. 13 illustrates a section taken along line XIII-XIII provided in FIG. 9. As illustrated in FIG. 13, a nut 230 is embedded in a portion of the case member 250 where the insertion hole 221h of the bus bar 220 is located and that is on the Z1 side in the Z1-Z2 direction relative to the insertion hole 221h. The nut 230 is integrated with the case member 250 by insert molding that is performed in the process of molding the case member 250 from resin. A case spot-faced portion 250r is provided in a portion of the case member 250 where the nut 230 is embedded and that is on the Z1 side in the Z1-Z2 direction relative to the nut 230. The nut 230 is placed at the bottom of the case spot-faced portion 250r. The case spot-faced portion 250r includes a ring-shaped protrusion 250a, which surrounds the nut 230 when seen from the Z1 side in the Z1-Z2 direction. The end of the protrusion 250a that is on the Z1 side in the Z1-Z2 direction is located on the Z2 side in the Z1-Z2 direction relative to the end face of the other portion of the case member 250 that is on the Z1 side in the Z1-Z2 direction. In short, the entirety of the ring-shaped protrusion 250a is located within the case spot-faced portion 250r.

As illustrated in FIGS. 11A and 13, the cover member 260 includes a cover spot-faced portion 260r, which is depressed toward the Z1 side in the Z1-Z2 direction. When the cover member 260 is set in the current sensor 200, the cover spot-faced portion 260r is located face to face with the case spot-faced portion 250r of the case member 250. The cover spot-faced portion 260r has at the bottom thereof a cover protrusion 260p, which has a ring shape conforming to the case spot-faced portion 250r. When the cover member 260 is set in the current sensor 200, the protrusion 250a of the case member 250 goes into a ring-shaped recess 260a, which is provided on the outer periphery of the cover protrusion 260p of the cover spot-faced portion 260r. Thus, a labyrinth structure is formed.

To summarize, the case member 250 and the cover member 260 have respective spot-faced portions at the bottoms of which respective ring-shaped protrusions are provided, and the spot-faced portions are positioned face to face with each other such that the respective protrusions mesh with each other. Thus, the current sensor 200 forms a flat structure with no projections on the Z1 side thereof in the Z1-Z2 direction while the creeping distance of the labyrinth structure is longer than in the current sensor 10 employing the protective covers 61, 62, and 63.

While the present invention has been described with reference to the above embodiments, the present invention is not limited to the above embodiments. Any improvements or changes can be made thereto in terms of improvement or within the spirit of the present invention.

As described above, the current sensor according to the present invention is advantageous in that shavings generated when a bolt for fastening an external terminal to the bus bar is screwed into the nut are prevented from dropping to the outside of the current sensor and in that irrelevant matter is prevented from entering the area where the nut for connecting and fastening the external terminal to the bus bar is located.

What is claimed is:

1. A current sensor comprising:
a bus bar through which a current to be measured flows;
a nut configured to fasten an external terminal to the bus bar by bringing the external terminal and the bus bar into contact with each other;
a magnetic sensor configured to detect a magnetic field generated by the current to be measured when flowing through the bus bar;
a case member having a housing for the magnetic sensor, the case member enclosing the bus bar and the nut therein; and
a cover member disposed over the housing,
wherein the nut has an end facing the bus bar and a through hole for receiving a bolt,
wherein the case member has an opening such that another end of the nut faces the opening, whereby the through hole is in communication with the opening, and wherein the current sensor further comprises:
an insulative protective member covering the opening and engaging with a surface of the case member around an entire outer periphery of the opening, thereby enclosing the opening.

2. The current sensor according to claim 1, wherein the protective member is integrally formed with the cover member.

3. The current sensor according to claim 1, wherein the opening includes a recess extending into an inner side of the case member, in which the nut is inserted, the recess being sealed by the protective member covering the opening.

4. The current sensor according to claim 2, further comprising:
a substrate on which the magnetic sensor is provided, the substrate being disposed in the housing of the case member,
wherein the substrate and the cover member are fastened to the case member with common screws.

5. A current sensor comprising:
a bus bar through which a current to be measured flows;
a nut configured to fasten an external terminal to the bus bar by bringing the external terminal and the bus bar into contact with each other;
a magnetic sensor configured to detect a magnetic field generated by the current to be measured when flowing through the bus bar;
a case member having a housing for the magnetic sensor, the case member enclosing the bus bar and the nut therein; and
a cover member disposed over the housing,
wherein the nut has an end facing the bus bar and a through hole for receiving a bolt,
wherein the case member has an opening such that another end of the nut faces the opening, whereby the through hole is in communication with the opening, and
wherein the current sensor further comprises an insulative protective member covering the opening,
wherein the case member includes a first counter surface on which the opening is provided, and the protective member includes a second counter surface facing the first counter surface,
and wherein one of the first counter surface and the second counter surface is provided with a protrusion that surrounds an outer periphery of the opening in a plan view seen from a facing direction of the first counter surface and the second counter surface, while the other of the first counter surface and the second counter surface is provided with a corresponding depression that is engageable with the protrusion.

6. The current sensor according to claim 5, wherein the protrusion and the depression are each located at a flat surface included in a corresponding one of the first counter surface and the second counter surface.

7. The current sensor according to claim 5, wherein the first counter surface has the protrusion while the second counter surface has the depression.

* * * * *